(12) United States Patent
Sundararajan et al.

(10) Patent No.: US 8,042,079 B1
(45) Date of Patent: Oct. 18, 2011

(54) SYNCHRONIZATION FOR A MODELING SYSTEM

(75) Inventors: Arvind Sundararajan, Sunnyvale, CA (US); Haibing Ma, Superior, CO (US); Andrew Dow, Edinburgh (GB); Singh Vinay Jitendra, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 244 days.

(21) Appl. No.: 12/468,764

(22) Filed: May 19, 2009

(51) Int. Cl.
*G06F 17/50* (2006.01)

(52) U.S. Cl. ........ 716/106; 716/121; 717/104; 717/109; 712/225

(58) Field of Classification Search .......... None
See application file for complete search history.

(56) References Cited

U.S. PATENT DOCUMENTS

| | | | |
|---|---|---|---|
| 6,219,628 B1 * | 4/2001 | Kodosky et al. .................. 703/2 |
| 6,292,925 B1 * | 9/2001 | Dellinger et al. ............. 716/113 |
| 6,678,645 B1 * | 1/2004 | Rajsuman et al. .............. 703/20 |
| 6,889,369 B1 | 5/2005 | Clifton et al. |
| 6,947,883 B1 | 9/2005 | Gupta |
| 6,968,514 B2 * | 11/2005 | Cooke et al. .................. 716/102 |
| 6,996,799 B1 * | 2/2006 | Cismas et al. ................. 717/106 |
| 7,185,301 B2 | 2/2007 | Hao et al. |
| 7,256,633 B1 * | 8/2007 | Rafiq ............................ 327/202 |
| 7,352,836 B1 * | 4/2008 | Mendenhall .................. 375/372 |
| 7,382,824 B1 * | 6/2008 | Marmash et al. ............. 375/224 |
| 7,480,609 B1 * | 1/2009 | Cavanagh et al. .............. 703/23 |
| 7,612,625 B2 | 11/2009 | Gao et al. |
| 2003/0210603 A1 * | 11/2003 | Ong .............................. 365/233 |
| 2005/0198459 A1 | 9/2005 | Bogin et al. |
| 2008/0065922 A1 | 3/2008 | Dour et al. |
| 2008/0256511 A1 * | 10/2008 | Lay et al. ...................... 717/109 |
| 2008/0320348 A1 | 12/2008 | Ayres et al. |
| 2009/0108900 A1 * | 4/2009 | Sotiriou et al. ................ 327/261 |
| 2009/0150136 A1 * | 6/2009 | Yang .............................. 703/13 |

OTHER PUBLICATIONS

Chiang, Anna S., Programming Enters Designer's COre, Electronic Engineering Times, Feb. 19, 2001, p. 106.*
U.S. Appl. No. 12/468,640, filed May 19, 2009, Sundararajan et al.
Altera Corp., *DSP Builder User Guide*, Dec. 2007, pp. 3-5 to 3-10 and 4-1 to 4-16 (23 pp.), available from Altera Corporation, Sunnyvale, California, USA.
Synplicity, Inc., *Synplify DSP User Guide*, Sep. 2007, pp. 3-2, 3-25 to 3-32, and 8-5 (11 pp.), Actel Edition, available from Synplicity, Inc., Sunnyvale, California, USA. Xilinx, Inc., *System Generator for DSP User Guide*, Mar. 2008, pp. 23-30 (9 pp.), Ver. 10.1, available from Xilinx, Inc., San Jose, California, USA.

* cited by examiner

*Primary Examiner* — Leigh Garbowski
*Assistant Examiner* — A. M. Thompson
(74) *Attorney, Agent, or Firm* — W. Eric Webostad; LeRoy D. Maunu

(57) ABSTRACT

Design synchronization for a High-Level Modeling System ("HLMS") of an integrated circuit device ("IC") is described. In a method for generating a netlist, a description of a first circuit block of a user design is input to a programmed computer system programmed with a computer-aided modeling system. The description includes output port information of the first circuit block and synchronization signal information. The computer-aided modeling system selects a circuit core for the first circuit block responsive to output port information and the synchronization signal information, the circuit core including port metadata. The computer-aided modeling system selects at least one macro responsive to the port metadata for generation of the netlist. The macro is for rate synchronized coupling of the first circuit block to a second circuit block of the user design. The computer-aided modeling system outputs the netlist including the macro.

17 Claims, 11 Drawing Sheets

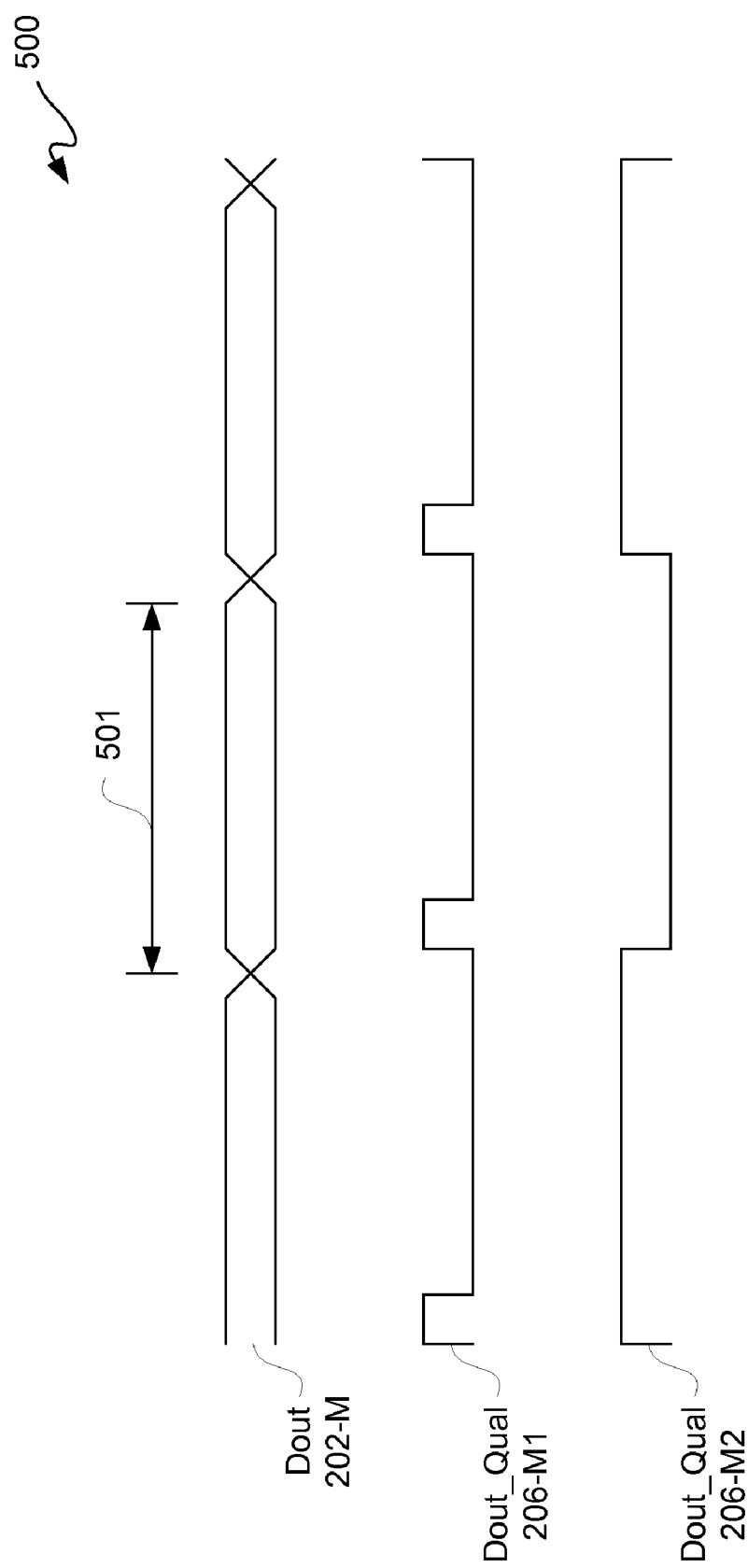

700

701 If (dout.period == sys_clk.period) {
    Associate MACRO 410 with dout and
return
}

702 If (dout.period == sys_sync.period) {
    Associate MACRO 420 with dout and
return
}

703 If (dout is a qualifier) {
    Associate MACRO 440 with dout and
return
}

704 If (dout is not a qualifier) {
    Associate MACRO 430 with dout and
return
}

FIG. 7

SYNCHRONIZATION FOR A MODELING SYSTEM

FIELD OF THE INVENTION

The invention relates to design of integrated circuit devices ("ICs"). More particularly, the invention relates to design synchronization for a High-Level Modeling System ("HLMS").

BACKGROUND OF THE INVENTION

A programmable logic device (PLD) is one type of integrated circuit containing features that can be electronically configured to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs are sometimes used for prototyping ICs. Because of the enhancements in PLDs, more complex designs may be prototyped and deployed using PLDs than in the past. Some of this design effort has been in the area of Digital Signal Processing ("DSP") applications. In DSP applications, the ability to process multiple rate data streams is sometimes relevant.

A software tool available from XILINX®, Inc. of San Jose, Calif., known as System Generator or "SysGen" is a high-level modeling and design software tool. SysGen may be used for developing, designing, and debugging integrated circuits that are implemented using field programmable logic gates of a PLD. Though the example of SysGen is used, it should be appreciated that there are other known high-level modeling and design software tools that may be used instead of SysGen, such as DSP Builder, available from ALTERA® Corporation of San Jose, Calif., or Synplify DSP, available from SYNOPSYS®, Inc. of Mountain View, Calif.

SysGen provides a graphical user interface for building a system as represented by a block diagram. Blocks specify rates and data types for outputs therefrom based on several factors. The factors include parameters of the blocks, and rates and data types of the inputs to the blocks.

Conventionally, these blocks are abstractions of high-level cores. A soft core ("core" for short) is a circuit described using text or code that is instantiated in field programmable logic gates using at least in part a configuration bitstream. Examples of cores include FIR filters, dividers, CIC filters, adders, and many other known circuits. An abstraction of such a core may among other things include transformation of an output sample of a block. This transformation may be to a form for SysGen or some other software tool to use.

Cores used in an HLMS, such as SysGen or some other software tool, facilitate any of a variety of designs being realized more rapidly. The interface of high-level cores may generally be represented as having a number of data inputs ports, a number of data output ports, a data input qualifier port, a data output qualifier port, a clock enable port, and a clock port. However, it should be appreciated that other interfaces for high-level cores may be used. More generally, a high-level core has some level of handshaking, such as qualifying data as valid or invalid for example. In contrast, a low-level core does not have any such handshaking.

A data input qualifier port is used to assert validity of input data, and may be set by a circuit that is upstream to the core or circuit block. A data output qualifier port may be used to assert validity of output data by the core or circuit block for a circuit coupled downstream to the core. It should be appreciated that a high-level core may be used to support a data streaming interface if the throughput of the circuit block is generally constant once such circuit block is active. In other words, inputs to such core change in such a way that an output qualifier is periodic. Even though, the example of data streaming cores is used for referring to high-level cores, it should be appreciated that other types of high-level cores may be used.

In an HLMS, such as SysGen or other HLMS software tool, system-wide synchronizer signals may be broadcast. Examples of such synchronizer signals include clock enable signals and clock signals. Accordingly, high-level core outputs may involve synchronization or re-sampling to fit within the context of a larger circuit's design environment. Heretofore, the process by which design synchronization, namely the coupling of synchronizers to high-level cores, was generally performed manually.

Accordingly, it would be desirable and useful to provide means for automatically adding synchronizers to a design for coupling a high-level core to a downstream circuit of the design.

SUMMARY OF THE INVENTION

One or more aspects generally relate to integrated circuit devices ("ICs") and, more particularly, to design synchronization for a High-Level Modeling System ("HLMS").

An aspect relates generally to a method for generating a netlist. A description of a first circuit block of a user design is input to a programmed computer system programmed with a computer-aided modeling system. The description includes output port information of the first circuit block and synchronization signal information. The computer-aided modeling system selects a circuit core for the first circuit block responsive to output port information and the synchronization signal information, the circuit core including port metadata. The computer-aided modeling system selects at least one macro responsive to the port metadata for generation of the netlist. The at least one macro is for rate synchronized coupling of the first circuit block to a second circuit block of the user design. The computer-aided modeling system outputs the netlist including the at least one macro.

Another aspect relates generally to another method for generating a netlist. A design description is provided to a modeling tool of a programmed computer. The design description includes description of a circuit block having handshaking associated therewith. The modeling tool generates a first parameterization for the circuit block responsive to the design description associated therewith. A core generator tool of the programmed computer selects a circuit core responsive to the circuit block and the first parameterization. The circuit core has structure and port metadata associated therewith. The circuit core is provided with a second parameterization responsive to the first parameterization and environment of the circuit block within the design description. The modeling tool selects at least one macro responsive to the second parameterization for coupling to an output port of the circuit core. The netlist including the at least one macro is output.

Yet another aspect relates generally to a machine-readable medium having stored thereon information representing instructions that, when executed by a processor, cause the processor to perform operations. The instructions are for a modeling tool and a core generator tool. The operations include obtaining a design description for a first portion of the instructions associated with the modeling tool. The design description includes description of a circuit block having handshaking associated therewith. The modeling tool generates a first parameterization for the circuit block responsive to the design description associated therewith. A portion of the instructions associated with the core generator tool select a circuit core responsive to the circuit block and the first parameterization. The circuit core has structure and port metadata associated therewith. The circuit core is provided with a second parameterization responsive to the first parameterization and environment of the circuit block within the design description. A second portion of the instructions associated with the modeling tool selects at least one macro responsive to the second parameterization for coupling to an output port of the circuit core. The netlist including the at least one macro is output.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 5 is a signal diagram depicting an exemplary embodiment of signal timing for a data out signal and associated data out qualifier signals.

FIG. 7 is a pseudo-code listing depicting an exemplary embodiment of a prioritizing algorithm for the macros illustratively shown with reference to FIGS. 4A through 4D.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
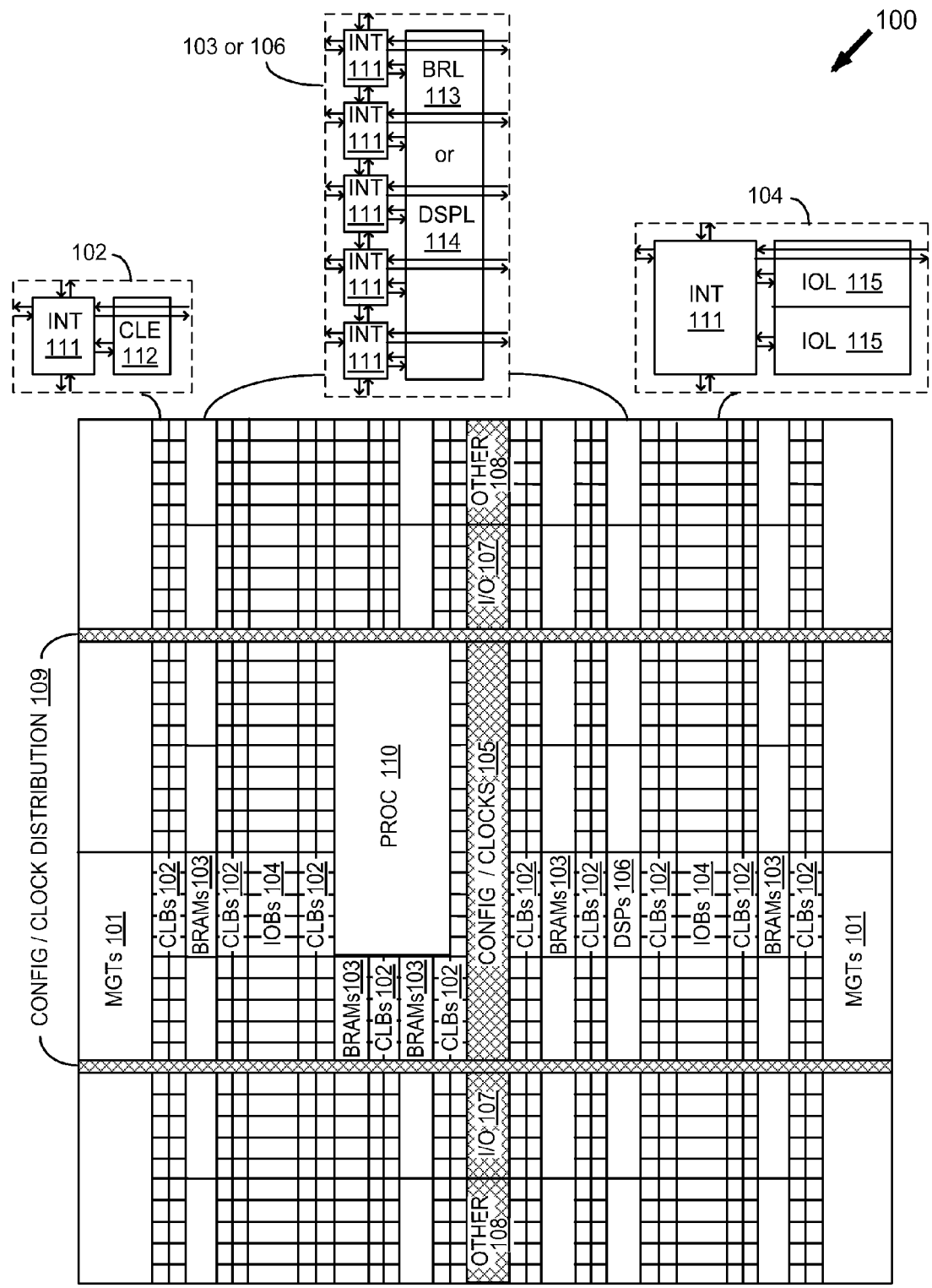
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

In the following description, outputs of a high-level core are automatically populated with macros. Such macros are for synchronization between the high-level core and a downstream circuit block as associated with a design tool incorporating the high-level core. Even though the following description is in terms of data streaming cores, it should be appreciated that other types of high-level cores may be used. Furthermore, even though the following description is in terms of SysGen, it should be appreciated that other HLMS software tools may be used. Furthermore, even though the following description is in terms of circuits, it should be understood that such circuits are actually just representations of circuits for purposes of an HLMS.

Figure 2:
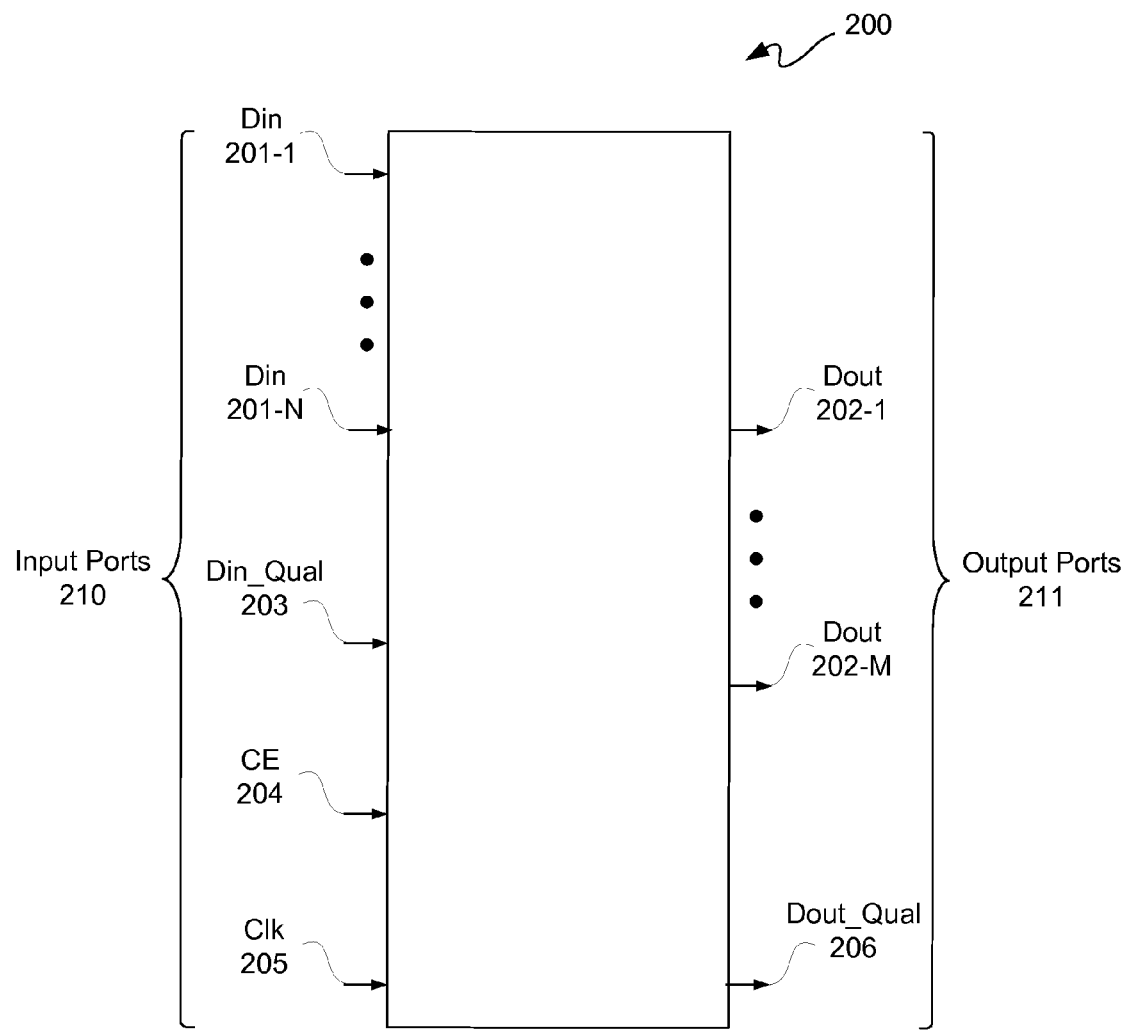
FIG. 2 is a block diagram depicting an exemplary embodiment of an input/output ("I/O") interface of a high-level core.

FIG. 2 is a block diagram depicting an exemplary embodiment of an I/O interface of a high-level core 200. High-level core 200 includes: data inputs 201-1 through 201-N, for N a positive integer greater than 1, to input ports 210, and data outputs 202-1 through 202-M, for M a positive integer greater than 1 from output ports 211. Additionally, high-level core 200 may include a data input qualifier port 203, a clock enable port 204, and a clock port 205, all of which are part of input ports 210. Additionally, high-level core 200 may include a data output qualifier port 206 as part of output ports 211.

Data input qualifier and data output qualifier ports 203 and 206 are for indicating whether input and output data, respectively, on an N input bus or M output bus, respectively, is valid. High-level core 200 may be used to support a data streaming interface, for example if throughput of such core is constant when active. In other words, data input qualifier port 203 for example may change in such a way that data output qualifier port 206 is periodic.

Accordingly, by design synchronization, it should be understood that "glue circuits" or "synchronizers" are coupled to outputs of a high-level core to correspond to a user's design environment. Thus, synchronizers coupled to outputs of a high-level core or high-level circuit block 200 are to correspond to such design environment, even though such synchronizers are not specifically called out in such user design. Thus, the inference of synchronizers from high-level circuit block outputs is to correspond with an intended operation of the design environment.

Figure 3:
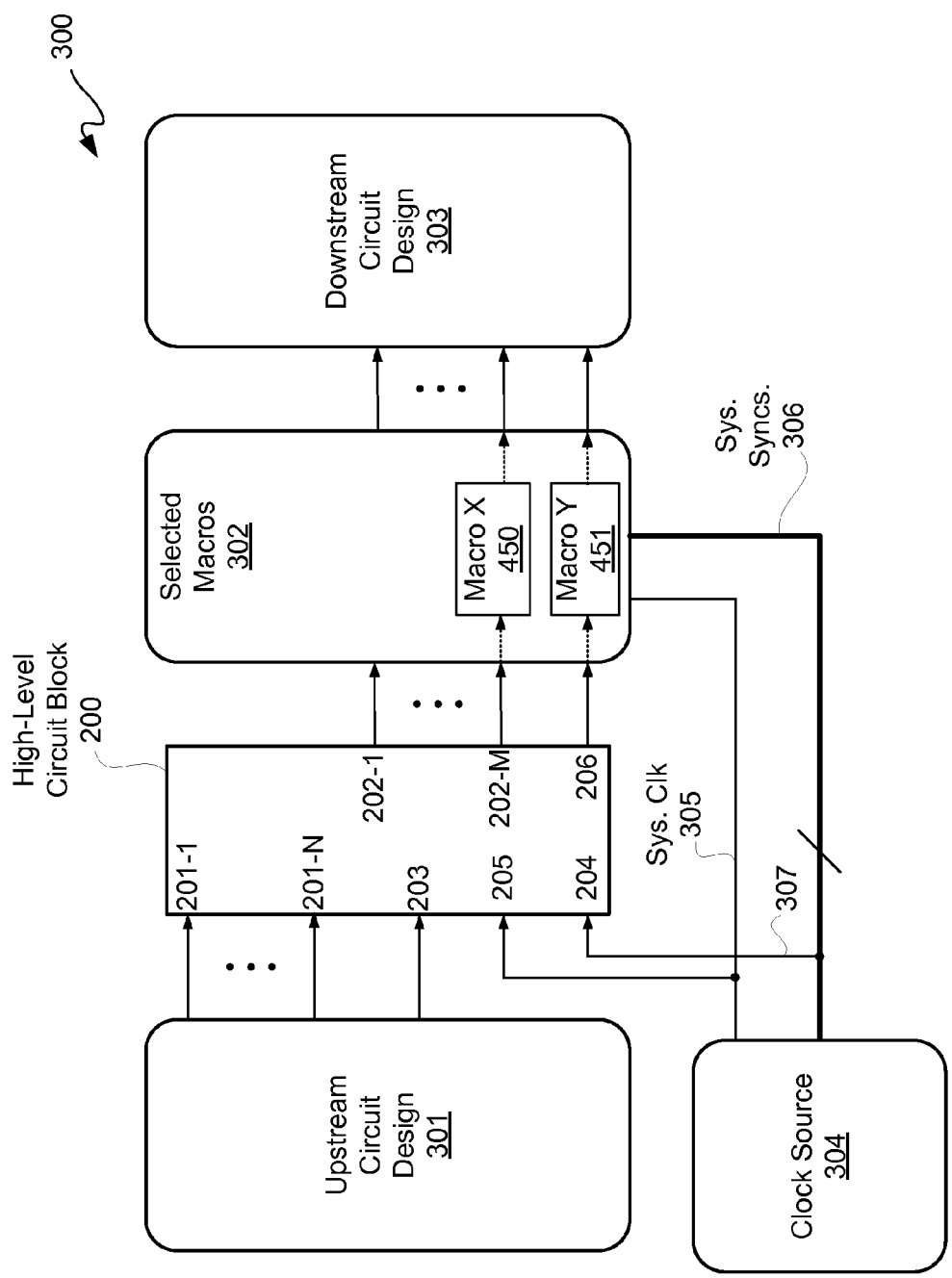
FIG. 3 is a block diagram depicting an exemplary embodiment of a design environment that includes the high-level core of FIG. 2.

FIG. 3 is a block diagram depicting an exemplary embodiment of a design environment 300 that includes high-level circuit block or core 200. Design environment 300 further includes a clock source 304, an upstream circuit design 301, selected macros 302, and a downstream circuit design 303. Clock source 304 broadcasts synchronization signals, namely system synchronization signals 306. Additionally, clock source 304 may output a system clock signal 305. Data is provided from design 301 to block 200 via inputs 201 and from block 200 to macros 302 via outputs 202. Additionally, upstream circuit design 301 may provide a qualifier signal to data input qualifier port 203 of block 200 and such qualifier signal may be provided from data output qualifier port 206 of high-level circuit block 202 to a macro of macros 302. Dotted lines to and from macros 450 and 451 are to indicate that such macros are selected for coupling block 200 to design 303. For example, data output 202-M is illustratively shown as going into macro X 450 and data output qualifier 206 is illustratively shown as going into macro Y 451 to indicate that different synchronizes may be selected for different types of inputs. Outputs from selected macros 302 may thus be provided to downstream circuit design 303.

System clock signal 305 may be provided to a clock port, such as clock port 205 of high-level circuit block 200. A system synchronization signal 307, which may be a clock enable signal, of system synchronization signals 306 may be provided to a clock enable port 204 of high-level circuit block 200. System clock signal 305 may be provided to selected macros 302 along with system synchronization signals 306.

Again, by "high-level" circuit block, it should be understood that there is at least some level of handshaking, even if at a very primitive level. In this particular example embodiment, the level of handshaking is input and output data qualifiers. Low-level cores may not have any handshaking even at a primitive level. Examples of such low-level cores may be an adder, a subtractor, a multiplier, or other circuit which merely automatically processes inputs and provides outputs without any qualification or indication of validity.

Upstream circuit design 301, as well as downstream circuit design 303, may be part of a user's circuit design environment. However, these circuit designs may have already been incorporated into a SysGen implemented design. Alternatively, either or both of upstream circuit design 301 and downstream circuit design 303 may also be a high-level circuit block where macros are selected for coupling for design synchronization. Along those lines, selected macros 302, which in this example include a macro X 450 and a macro Y 451 though fewer or more than these two macros may be implemented, are selected as synchronizers for design synchronization for a user design's intended environment.

Again, it should be appreciated that FIG. 3 represents an HMLS model of a design and not actual circuitry. However, from such a model, a netlist may be generated, where the netlist may be used to generate a configuration bitstream for instantiation of a user design in field programmable logic gates of an FPGA. Macros 450 and 451 are of a set of selected macros 302 for design synchronization, namely for coupling high-level circuit block 200 outputs to downstream circuit design 303 for corresponding with a user design environment. The more information regarding outputs of high-level circuit block 200 the more tailored the selection of macros may be for selected macros 302 in order to provide a more efficient implementation of a user design. Using information regarding outputs of high-level circuit block 200, macros 302 are automatically selected though inference.

Figure 8:
FIG. 8 is a flow diagram depicting an exemplary embodiment of a design synchronization flow.

This automated inference of synchronizers may be broken out into operations. These operations are generally indicated in FIG. 8, where there is shown a flow diagram depicting an exemplary embodiment of a design synchronization flow 800. At 801, a pool or library of synchronizer macros is located.

FIGS. 4A through 4D are circuit diagrams depicting respective exemplary embodiments of macros, which may be selected for selected macros 302 of FIG. 3. It should be appreciated that these are merely a few examples of macros, and these or other macros may be used as synchronizers.

Figure 4B:
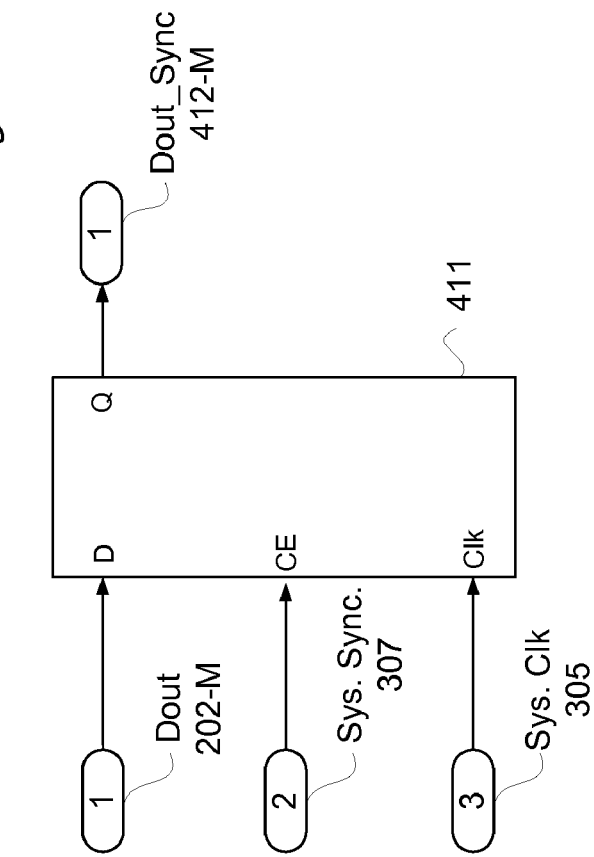
FIGS. 4A through 4D are circuit diagrams depicting respective exemplary embodiments of macros, which may be selected for selected macros of the design environment of FIG. 3.
Figure 4A:
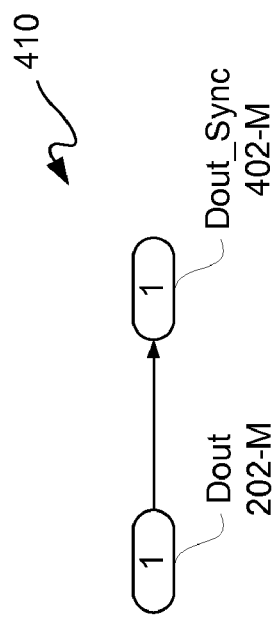

With reference to FIG. 4A, macro 410 is a point-to-point macro, where for example data out 202-M is provided as a data out sync 402-M, where "sync" indicates a synchronizer for design synchronization.

With reference to FIG. 4B, macro 420 is a register macro, where data out 202-M is provided to a data port of register 411. A system sync signal, such as system synchronous signal 307, is provided to a clock enable port of register 411, and a clock port of register 411 receives system clock signal 305. Data output of register 411 is data out sync signal 412-M.

It should be appreciated that in an HLMS, such as for example SysGen, system wide synchronization signals may be broadcast. In the context of programmable logic fabric, clock enable signals may be propagated through programmable logic gates of such programmable logic fabric, and clock signals may be propagated through a clock circuit, such as a clock tree, or through programmable gates of programmable logic fabric, or a combination thereof.

Figure 4C:
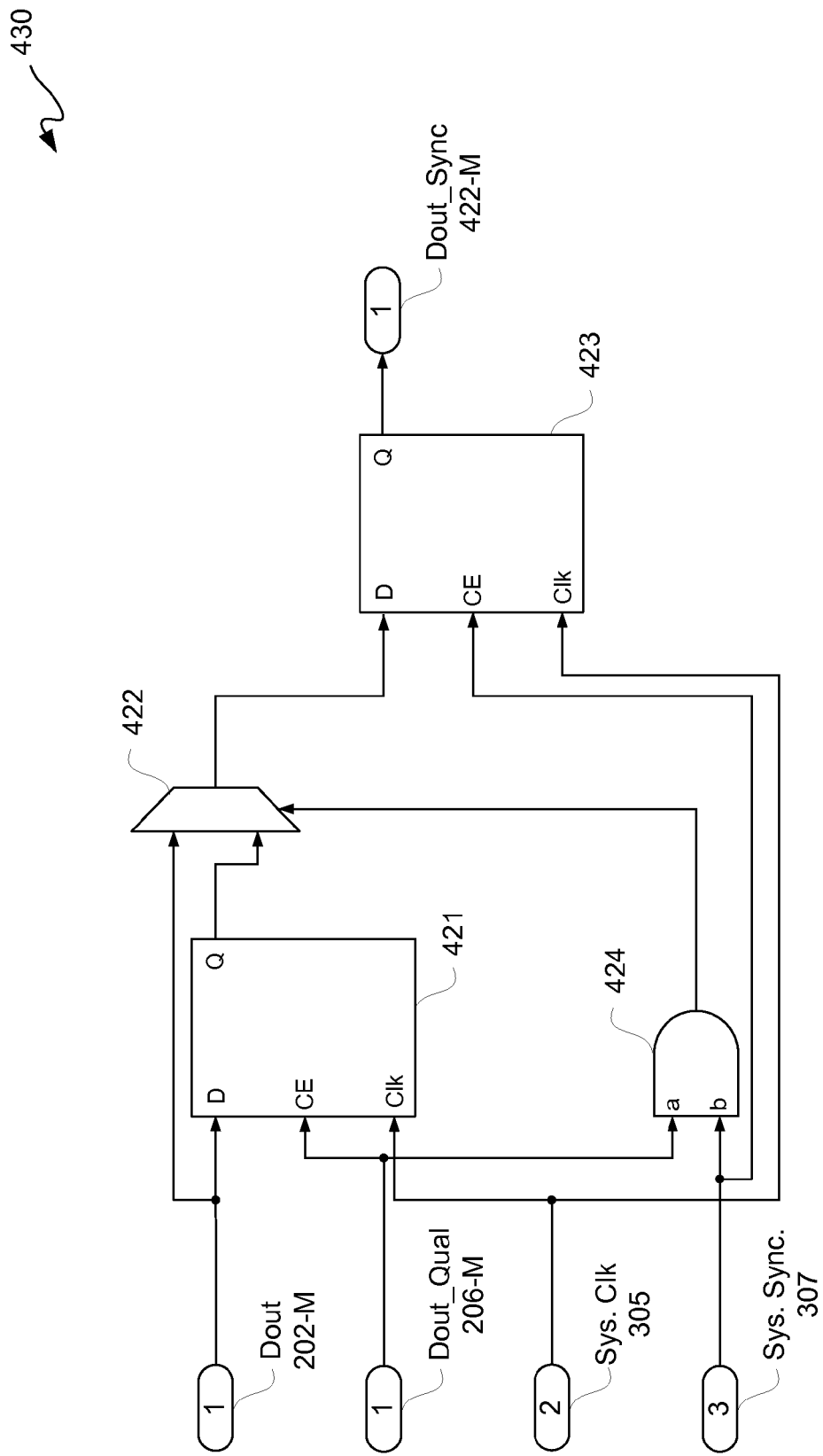

With reference to FIG. 4C, macro 430 receives data out qualifier signal 206-M for indicating validity/invalidity status of data out signal 202-M. Data output qualifier signal 206-M is provided to a clock enable port of register 421 and to an input port of AND gate 424 both of macro 430. Data out signal 202-M is provided to a data input port of register 421 and to an input port of multiplexer 422 both of macro 430. System clock signal 305 is provided to a clock port of register 421 and to a clock port of register 423 both of macro 430. System synchronous signal 307 is provided to another input port of AND gate 424 and to a clock enable port of register 423. Data output of register 421 is provided to another input of multiplexer 422, and a control select port of multiplexer 422 receives the output of AND gate 424.

Output of multiplexer 422 is provided to a data input port of register 423, and output of register 423 is data out sync signal 422-M. In this exemplary embodiment, the data out qualifier is used to qualify data before it is pushed out, and register 423 is used to re-synchronize data for providing data out sync signal 422-M.

Figure 4D:
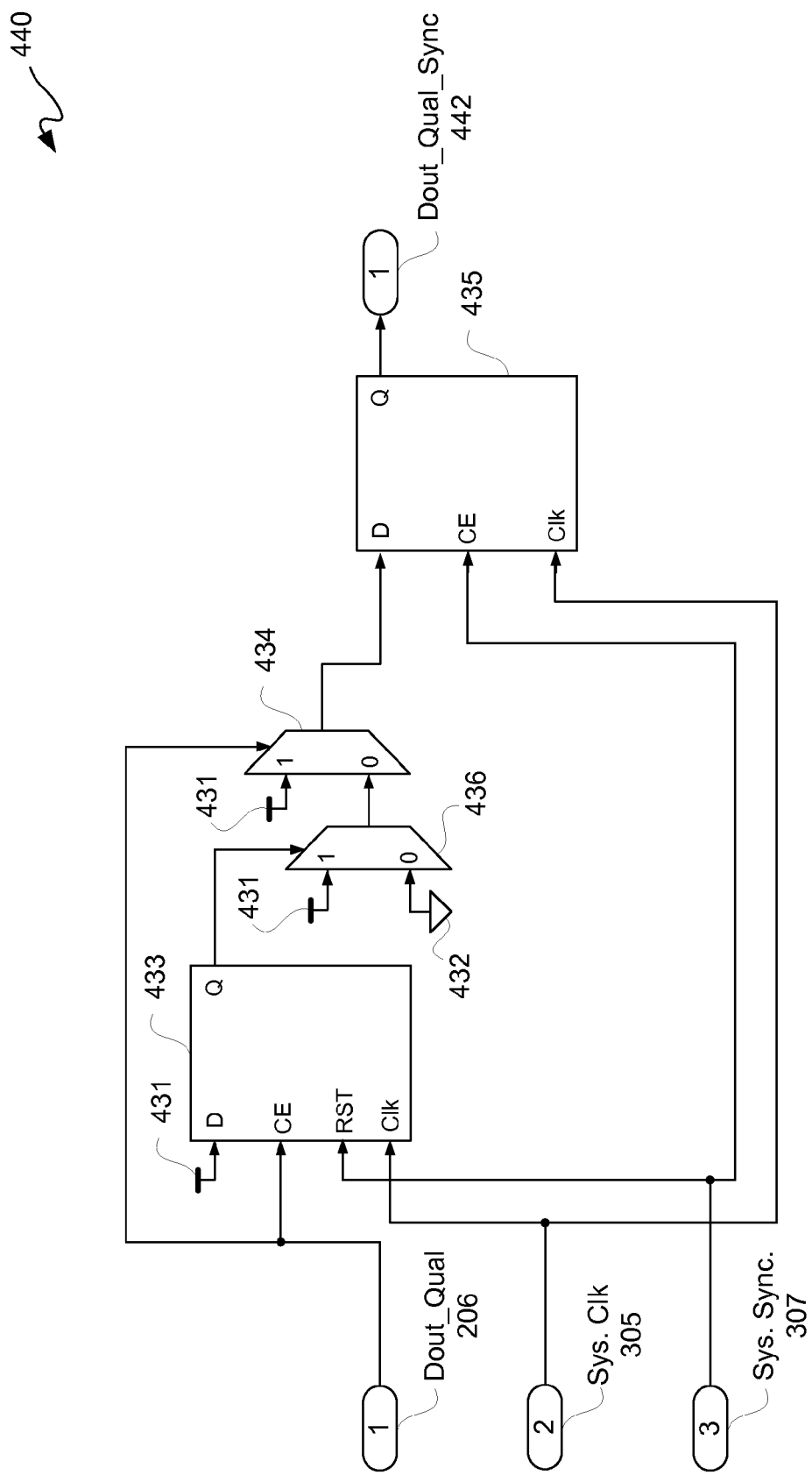

With reference to FIG. 4D, a circuit diagram of a macro 440 is illustratively shown. Data out qualifier signal 206 is provided to a clock enable port of register 433 and to a control select port of multiplexer 434. System clock signal 305 is provided to a clock port of register 433 and to a clock port of register 435. System synchronous signal 307 is provided to a reset port of register 433 and to a clock enable port of register 435.

Data input port of register 433 is coupled to receive a logic 1 431, for example coupled to a supply voltage level such as Vdd or Vcc. Furthermore, inputs to multiplexer 434 and 436 are coupled to receive logic 1s 431. Another input to multiplexer 436 is coupled to receive a logic 0, such as coupling to a ground 432. Ground 432 may be an actual or virtual ground.

A control select input of multiplexer 436 is sourced from the output of register 433, and the output of multiplexer 436 is provided to another input of multiplexer 434. Output of multiplexer 434 is provided as a data input to register 435, and register 435 provides a data output qualified sync signal 442. So, generally, macro 440 is to qualify the data output qualifier itself in contrast to qualifying the data output as in macro 430 of FIG. 4C.

It should be appreciated that macros other than those illustratively shown in FIGS. 4A through 4D may be in the pool of macros located at 801 of FIG. 8. Other examples of macros may include a FIFO, a dual port BRAM, and a DSP block, among other types of macros that may be used as synchronizers.

Returning to FIG. 8, at 802, a high-level core is parameterized. This parameterization may be done using a graphic user interface in accordance with SysGen or may be automatically inferred by SysGen based on the context of the high-level core within the design environment. For example, an FIR filter core or other high-level core may have parameters that are inferable from the context in which such core is deployed.

After parameterization of such high-level core at 802, ports of such high-level core may be populated with port properties at 803 at least partially responsive to the parameterization at 802. Port properties may be populated from port metadata. Port metadata may generally be categorized into three groups, namely signal type, qualifier, and period. A signal type port property may delineate whether a signal is a data signal, address signal, or command signal, for example. Some data types may be inferred from inherency with respect to a high-level core. For example, FIR filter coefficients may be inferred as being inherent to an FIR filter core. Alternatively or additionally, each core of a core generator library may specify signal types for such core.

A period port property may indicate that an output value produced by such a port remains unchanged within a period window. A qualifier port property may indicate whether such a port is an output qualifier, such as data out qualifier port 206 for example. Other examples of port qualifiers are valid, set, reset, and ready-for-data ("RFD"), among other known types of port qualifiers.

FIG. 5 is a signal diagram depicting an exemplary embodiment of signal timing 500. Data out signal 202-M may be qualified with data out qualifier signal 206-M1 and data out qualifier signal 206-M2. A period 501 of data out signal 202-M is illustratively shown. Period 501 indicates that within such time period the output value produced by data out signal 202-M remains unchanged within period window 501.

Returning to FIG. 8, assignment of port properties may use a two-way communication between an HLMS and a high-level core 200. At 804, in response to population of port properties at 803, macros are selected for association with ports of such high-level core, and connectivity, such as to a downstream circuit design, is elaborated.

Figure 6:
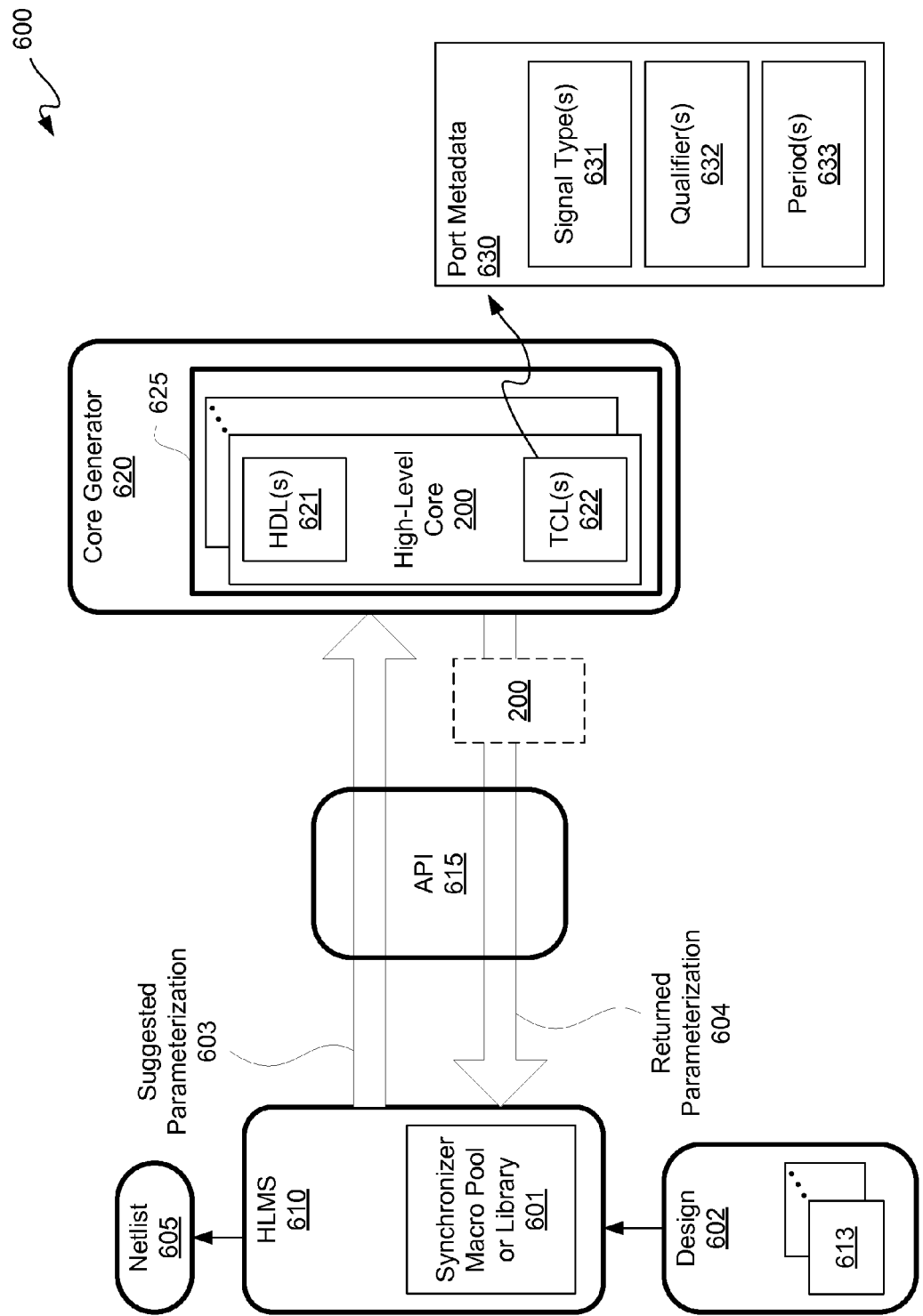
FIG. 6 is a block diagram depicting an exemplary embodiment of a High-Level Modeling System ("HLMS") coupled to a core generator using an application program interface.

FIG. 6 is a block diagram depicting an exemplary embodiment of a modeling system 600. Modeling system 600 includes HLMS 610 coupled to a core generator 620 using an application program interface ("API") 615. It should be understood that modeling system 600 may be implemented in a computer system or a network of computer systems.

HLMS 610 has access to a synchronizer macro pool or library 601. Design 602 is input to HLMS 610. Design 602 includes one or more high-level circuit blocks 613. It should be understood that such high-level circuit blocks 613 are generally called out in a design at a black box level, without any particular reference to structure. For VHDL, this black box level may be an entity or architectural body level. Furthermore, such high-level circuit blocks 613 may or may not have parameters of operation of such blocks specifically called out in design 602. In contrast, once a high-level circuit block or core 200 is selected, structure and parameters of such block or core are specified.

Responsive to such high-level circuit blocks 613 and the context or environment in which such circuit blocks exist within design 602, HLMS 610 may provide a suggested parameterization 603 to core generator 620 via API 615. For purposes of clarity by way of example and not limitation, processing of a single high-level circuit block 613 is described, as processing of multiples thereof will be understood from such description.

If there is no core generator 620, then HLMS 610 may assign default core properties to the ports of high-level circuit block 613. For example, each port may be treated as a non-qualifier with a period equal to the clock period of an associated clock, such as for example the clock period of system clock 305. In other words, a period of system clock 305 of FIG. 3 may generally be used as a global synchronizing signal for design 602.

Assuming a core generator is accessible by HLMS 610 for two-way communication, suggested parameterizations 603 may be received by core generator 620 for each high-level circuit block 613 in order to select cores for instantiation of such blocks 613. It should be understood that low-level circuit blocks may be included in design 602, but are not processed the same as high-level circuit blocks 613. In other words, because low-level circuit blocks process and provide data without qualification, selection of macros as described herein need not performed for low-level circuit blocks.

Core generator 620 may be COREGEN®, which is a core generator software available from XILINX®, Inc., of San Jose, Calif. However, other known core generators, other than COREGEN®, may be used. Examples of other core generator tools include MEGACORE® Wizard available from ALTERA® Corporation of San Jose, Calif.

Core generator 620 has access to a high-level core library 625. High-level core library 625 has at least one, and likely more than one, high-level core 200. Each of such cores 200 may be defined by at least two types of files, namely at least one hardware description language ("HDL") file 621 and at least one tool command language ("TCL") file 622. An HDL file 621 describes the structure of high-level core 200 and TCL file 622 describes the port metadata 630 of such structure.

Port metadata 630 may include one or more signal types 631, one or more qualifiers 632, and one or more periods 633 for high-level core 200. For purposes of clarity by way of example and not limitation, it shall be assumed that the HDL is VHDL though other known HDLs, such as Verilog, may be used.

A limitation of VHDL is that interfaces described using VHDL are not capable of specifying port signal type. In other words, there is no distinction between a data port, a control port, an address port, or other type of port in VHDL. Accordingly, TCL file 622 having port metadata 630 provides parameterization of the ports, which means in part that signal type or types 631 for ports of high-level core 200 are specified. Additionally, it should be appreciated that some signal types may be obtained by inherency from core 200. For example, an FIR filter will have coefficient inputs.

Port metadata 630, in addition to one or more signals types 631, may include one or more qualifiers 632. In addition to validity/invalidity qualifiers as described above, there may be a reset, a set, a ready for data ("RFD"), or some other known type of qualifier. Furthermore, one or more periods 633, which may be associated with different data rates, may be included if specified or a default value may be used. Period may be inferentially obtained. For example, for an interpolating FIR filter, an input data rate may be X and an output data rate may be 2×. Accordingly, knowing the input data rate allows the output data rate to be inferentially obtained. By "inferentially obtained," it is meant that the parameter is not specified, but based on the information available, a parameter may be selected which would correspond to the parameter had it been specified.

In response to suggested parameterization 603, a high-level core 200 for high-level circuit block 613 is obtained from high-level core library 625 and returned with a return parameterization 604 to HLMS 610. Accordingly, it should be appreciated that the high-level core 200 selected is responsive to both the suggested parameterization 603 as well as the tool, namely HLMS 610, requesting such parameterization. Such high-level core 200 returned, however, may include all, some, or none of suggested parameterization 603, and additionally may include additional port metadata not part of suggested parameterization 603. In other words, responsive to the level of detail in suggested parameterization 603, which may be expressly presented in design 602, or inferentially obtained from design 602, or a combination thereof, with respect to high-level circuit block 613, the high-level core 200 returned may be more or less tailored to the application called out for by design 602. In other words, the more information in suggested parameterization 603, the more tailored or efficient the high-level core 200 may be.

Responsive to return parameterization 604 included with high-level core 200, one or more synchronizers from synchronizer macro library 601 may be selected for coupling to a downstream circuit.

Accordingly, for each high-level circuit block 613 in design 602, each high-level core 200 may be selected by core generator 620 having parameters, and such parameters may be used for selecting macros from library 601 for design synchronization, as previously described, for generating a netlist 605.

With respect to selecting macros from synchronizer macro library 601, such macros are selected responsive to return parameterization 604. As previously indicated, if no period is provided, a single rate system based on the system clock period may be assumed as a default. However, rates may be inferred as previously indicated with respect to an interpolated FIR having a faster data rate on the output than the input. Furthermore, for example if the FIR filter was a decimating filter, then the output data rate would be slower than the input data, and this too may be inferred. If a low-level circuit block, namely one without any handshaking, was implemented, there may be no need to communicate with core generator 620 for obtaining a parameterized core.

While macros selected need not always be the most hardware intensive, the most hardware intensive macros may be selected to handle worst case scenarios if a user does not provide sufficient specificity such that less hardware intensive macros may be selected. However, if a user specifies some parameters or some parameters may be inferred by context, or a combination thereof, macros may be tailored to the application so as to reduce the amount of resources consumed for synchronizers. In other words, the accuracy may more closely match the application such that the amount of resources used likewise matches the application.

Thus, using the full duplex communication between HLMS 610 and core generator 620 for obtaining a return parameterization 604 in response to suggested parameterization 603 may lead to macro selection. This macro selection may involve a hierarchical selection process.

FIG. 7 is a pseudo-code listing depicting an exemplary embodiment of a prioritizing algorithm 700 for the macros illustratively shown with reference to FIGS. 4A through 4D. Of course, other prioritizations other than the one illustratively shown with reference to FIG. 7 may be used, depending on the available macros and the application.

At 701, a first level threshold for associating a macro with a data out is illustratively shown. At 701, if the data out period is defined as the system clock period, such as in a single rate application as previously described, then macro 410 of FIG. 4A is associated with such data out. If, however, the data out period is defined by a system synchronous signal such as one of system synchronous signals 306, namely the time period of broadcast system synchronous signals 306 as they pertain to the data out period for the data out port of interest, then macro 420 of FIG. 4B is associated with such data out port at 702. If however, data out is a qualifier, then macro 440 of FIG. 4D is associated with the data out port being processed as determined at 703. Lastly, at 704, if it is determined that the data out port is not a qualifier, but it has not met any of the conditions set forth at any of operations 701-703, then macro 430 of FIG. 4C is associated with such data out port.

Prioritizing algorithm 700 as described herein prioritizes macros based on the amount of hardware resources used to realize the associated synchronizer. Thus, the progression is from the least amount of hardware resources to the most amount of hardware resources potentially used. In this least-to-most hardware resources prioritization, circuit resources may be conserved with respect to an actual implementation of a design and thus power may also be conserved. Thus, hierarchically selected synchronizers have circuit resources that are accurate as to the application. By "accurate," it is meant that speed and throughput may be more optimal than if more resource excessive selections were made for macro synchronizers.

As indicated in operation 804 of FIG. 8, after the macros are associated with the ports of a high-level core, connectivity of such macros synchronizers to a downstream circuit is elaborated. By this it is meant that such macros are connected to the output ports to which they are identified and to the downstream circuit, as generally indicated for example with respect to macros X 450 and macro Y 451 being associated with ports 202-M and 206, respectively, within the context of a netlisting.

Accordingly, it should be appreciated that rate synchronizers may be automatically inferred for a high-level core in a high level design tool, such as an HLMS, responsive at least partially to broadcasting of synchronization signals. Furthermore, a two-way or full duplex communication between a high-level core generator and a high-level modeling software tool, such as an HLMS incorporating a high-level circuit block, is described in order to arrive at a parameterized high-level circuit block. If sufficient information is provided for such high-level circuit block, an optimal selection with respect to circuit synchronizer resources may be obtained for accuracy of design synchronization. Even though prioritizing synchronizer macros is based on hardware resources, it should be appreciated that other prioritizations, such as prioritizing according to speed, power consumption, or some other prioritization scheme, or a combination of two or more such prioritizing schemes may be used to guide selection of macros.

Figure 9:
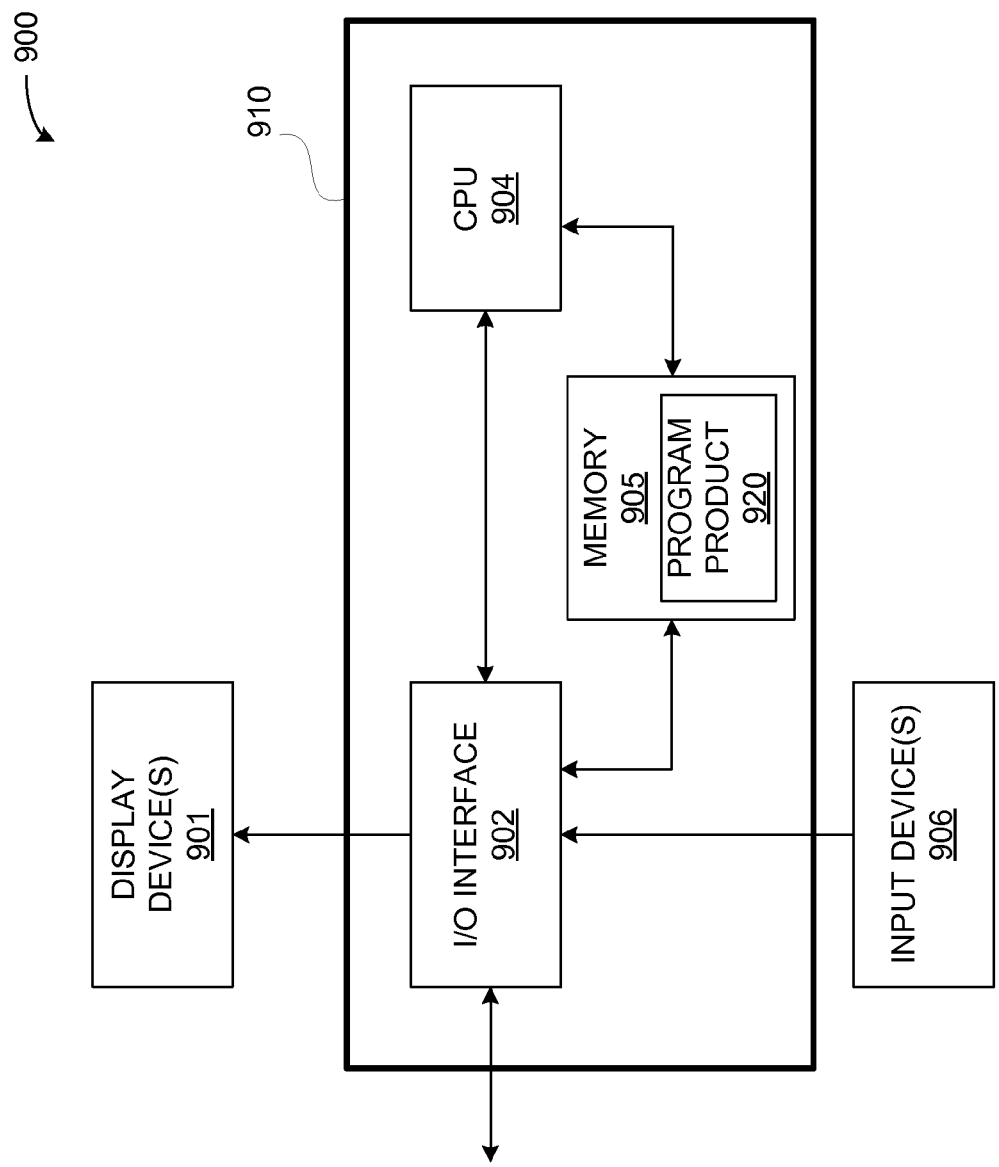
FIG. 9 is a block diagram of an exemplary embodiment of a computer system in which the design environment and HLMS described herein may be implemented.

FIG. 9 is a block diagram of an exemplary embodiment of a computer system 900. Computer system 900 may include a programmed computer 910 coupled to one or more display devices 901, such as Cathode Ray Tube ("CRT") displays, Plasma displays, Liquid Crystal Displays ("LCD"), and to one or more input devices 906, such as a keyboard and a cursor pointing device. Other known configurations of a computer system may be used.

Programmed computer 910 may be programmed with a known operating system, which may be Mac OS, Java Virtual Machine, Linux, Solaris, Unix, or a Windows operating system, among other known platforms. Programmed computer 901 includes a central processing unit (CPU) 904, memory 905, and an input/output ("I/O") interface 902. CPU 904 may be a type of microprocessor known in the art, such as available from IBM, Intel, and Advanced Micro Devices for example. Support circuits (not shown) may include conventional cache, power supplies, clock circuits, data registers, and the like. Memory 905 may be directly coupled to CPU 904 or coupled through I/O interface 902. At least a portion of an operating system may be disposed in memory 905. Memory 905 may include one or more of the following: random access memory, read only memory, magneto-resistive read/write memory, optical read/write memory, cache memory, magnetic read/write memory, and the like, as well as signal-bearing media as described below.

I/O interface 902 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 902 may be coupled to a conventional keyboard, network, mouse, display printer, and interface circuitry adapted to receive and transmit data, such as data files and the like. Notably, programmed computer 910 may be coupled to a number of client computers, server computers, or any combination thereof via a conventional network infrastructure, such as a company's Intranet and/or the Internet, for example, allowing distributed use for interface generation.

Memory 905 may store all or portions of one or more programs or data to implement processes in accordance with one or more aspects of HLMS 610 and core generator 620 of FIG. 6, as well as associated design and core information for operation thereof. HLMS 610 and core generator 620, while capable of being bundled as a single product or sold as separate products, are generally indicated as a "program product" 920 for clarity. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product 920, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for generating a netlist, comprising:
   in a programmed computer system programmed with a computer-aided modeling system, accepting a description of a first circuit block of a user design the description including output port information of the first circuit block and synchronization signal information;
   selecting a circuit core for the first circuit block responsive to output port information and the synchronization signal information, the circuit core including port metadata;
   selecting, from a plurality of different types of macros, at least one macro responsive to the port metadata for generation of the netlist, the at least one macro being for rate synchronized coupling of the first circuit block to a second circuit block of the user design;
   wherein the plurality of macros includes at least a point-to-point macro, a register macro, and a first data-out qualifier macro that registers data from the first circuit block in response to a data-out qualifier signal from the first circuit block; and
   outputting the netlist including the at least one macro.

2. The method according to claim 1, wherein the user design further includes at least one parameter for the first circuit block.

3. The method according to claim 2, wherein the circuit core includes structure; wherein the structure is in a hardware description language file; and wherein the port metadata are in a tool command language file.

4. The method according to claim 1, wherein the port metadata are to include period information, qualifier information, and data type information.

5. The method of claim 1, wherein the plurality of macros further includes a second data-out qualifier macro that registers the data-out qualifier signal from the first circuit block in response to the data-out qualifier signal from the first circuit block.

6. A method for generating a netlist, comprising:
   providing a design description to a modeling tool of a programmed computer, the design description including description of a circuit block having handshaking associated therewith;
   generating by the modeling tool a first parameterization for the circuit block responsive to the design description associated therewith;
   selecting by a core generator tool of the programmed computer a circuit core responsive to the circuit block and the first parameterization, the circuit core having structure and port metadata associated therewith;
   providing the circuit core with a second parameterization responsive to the first parameterization and environment of the circuit block within the design description;
   selecting by the modeling tool from a plurality of different types of macros, at least one macro responsive to the second parameterization for coupling to an output port of the circuit core;
   wherein the plurality of macros includes at least a point-to-point macro, a register macro, and a first data-out qualifier macro that registers data from the first circuit block in response to a data-out qualifier signal from the first circuit block; and
   outputting the netlist including the at least one macro.

7. The method according to claim 6, further comprising:
   hierarchically ordering a set of macros for selection of the at least one macro; and
   progressing through the set of macros in hierarchical order for selection of the at least one macro.

8. The method according to claim 7, wherein the set of macros is ordered from least to most circuit resources.

9. The method according to claim 7, wherein the at least one macro is selected for having the least amount of circuit resources in the set of macros for the second parameterization.

10. The method according to claim 6, wherein the port metadata include period information, qualifier information, and data type information.

11. The method of claim 6, wherein the plurality of macros further includes a second data-out qualifier macro that registers the data-out qualifier signal from the first circuit block in response to the data-out qualifier signal from the first circuit block.

12. A non-transitory machine-readable medium having stored thereon information representing instructions that, when executed by a processor, cause the processor to perform operations comprising:
   the instructions being for a modeling tool and a core generator tool;
   obtaining a design description for a first portion of the instructions associated with the modeling tool;
   the design description including description of a circuit block having handshaking associated therewith;
   generating by the modeling tool a first parameterization for the circuit block responsive to the design description associated therewith;
   selecting by a portion of the instructions associated with the core generator tool a circuit core responsive to the circuit block and the first parameterization;
   the circuit core having structure and port metadata associated therewith;
   providing the circuit core with a second parameterization responsive to the first parameterization and environment of the circuit block within the design description;
   selecting by a second portion of the instructions associated with the modeling tool from a plurality of different types of macros, at least one macro responsive to the second parameterization for coupling to an output port of the circuit core;
   wherein the plurality of macros includes at least a point-to-point macro, a register macro, and a first data-out qualifier macro that registers data from the first circuit block in response to a data-out qualifier signal from the first circuit block; and outputting the netlist including the at least one macro.

13. The medium according to claim 12, wherein the operations further comprise:

hierarchically ordering a set of macros for selection of the at least one macro; and progressing through the set of macros in hierarchical order for the selection of the at least one macro.

14. The medium according to claim 13, wherein the set of macros is ordered from least to most circuit resources.

15. The medium according to claim 13, wherein the at least one macro is selected for having the least amount of circuit resources in the set of macros for the second parameterization.

16. The medium according to claim 12, wherein the port metadata include period information, qualifier information, and data type information.

17. The non-transitory machine-readable medium of claim 12, wherein the plurality of macros further includes a second data-out qualifier macro that registers the data-out qualifier signal from the first circuit block in response to the data-out qualifier signal from the first circuit block.

* * * * *